United States Patent
Sawai et al.

(10) Patent No.: US 9,411,409 B2
(45) Date of Patent: *Aug. 9, 2016

(54) DATA PROCESSING SYSTEM HAVING POWER CAPPING FUNCTION IN RESPONSE TO OUTPUT STATE OF POWER SUPPLY MODULE

(71) Applicant: Hitachi, Ltd., Tokyo (JP)

(72) Inventors: Ryo Sawai, Hadano (JP); Koichi Hasegawa, Hadano (JP); Yusuke Mure, Hadano (JP); Kazuya Taniguchi, Hadano (JP)

(73) Assignee: Hitachi, Ltd., Tokyo (JP)

( * ) Notice: Subject to any disclaimer, the term of this patent is extended or adjusted under 35 U.S.C. 154(b) by 284 days.

This patent is subject to a terminal disclaimer.

(21) Appl. No.: 13/956,723

(22) Filed: Aug. 1, 2013

(65) Prior Publication Data

US 2013/0318376 A1 Nov. 28, 2013

Related U.S. Application Data

(63) Continuation of application No. 13/072,283, filed on Mar. 25, 2011, now Pat. No. 8,504,861.

(30) Foreign Application Priority Data

Jun. 16, 2010 (JP) .................. 2010-136740

(51) Int. Cl.
| | |
|---|---|
| G06F 11/30 | (2006.01) |
| G06F 1/26 | (2006.01) |
| G06F 1/32 | (2006.01) |
| G06F 11/00 | (2006.01) |
| G06F 11/20 | (2006.01) |
| H05K 7/14 | (2006.01) |
| G06F 1/28 | (2006.01) |
| G06F 15/78 | (2006.01) |

(52) U.S. Cl.
CPC .............. *G06F 1/3296* (2013.01); *G06F 1/324* (2013.01); *G06F 1/3206* (2013.01); *G06F 1/3234* (2013.01); *G06F 11/2015* (2013.01); *H05K 7/1498* (2013.01); *G06F 1/28* (2013.01); *G06F 15/7803* (2013.01); *Y02B 60/1217* (2013.01); *Y02B 60/1285* (2013.01); *Y02B 60/32* (2013.01); *Y10T 307/50* (2015.04)

(58) Field of Classification Search
None
See application file for complete search history.

(56) References Cited

U.S. PATENT DOCUMENTS

| | | | |
|---|---|---|---|
| 7,617,406 B2 | 11/2009 | Yasuo | |
| 7,650,517 B2 | 1/2010 | Hughes et al. | |

(Continued)

FOREIGN PATENT DOCUMENTS

| | | |
|---|---|---|
| JP | 2002-073221 A | 3/2002 |
| JP | 2007-172601 A | 7/2007 |
| JP | 2009-267880 | 11/2009 |

*Primary Examiner* — Ji H Bae
(74) *Attorney, Agent, or Firm* — Foley & Lardner LLP

(57) ABSTRACT

A data processing system includes a plurality of power supply modules each having a comparing unit for comparing an output-current value supplied to a computer with a threshold value, the plurality of power supply modules continue the comparison when the output-current value is equal to or less than the threshold value and outputs an output-current excess signal to a plurality of server blades when the output-current value is equal to or greater than the threshold value, and the plurality of server blades control respectively power consumptions of the server blades to make a power consumption value of the server blades to an equal to or less than a predetermined value on a power source non-redundancy.

8 Claims, 8 Drawing Sheets

(56) References Cited

U.S. PATENT DOCUMENTS 8,880,922 B2 * 11/2014 Siba et al. .................... 713/323
2009/0049316 A1    2/2009  Khatri et al.
2009/0319808 A1 * 12/2009  Brundridge et al. .......... 713/300
2010/0037070 A1 *  2/2010  Brumley et al. .............. 713/300

* cited by examiner

FIG.5

POWER TABLE 404

| IDENTIFICATION DATA (501) | MODULE CLASSIFICATION (502) | MAXIMUM POWER CONSUMPTION (503) | MAXIMUM POWER CONSUMPTION ON OPERATING MODE A (504) | MAXIMUM POWER CONSUMPTION ON OPERATING MODE B (505) | MAXIMUM POWER CONSUMPTION ON OPERATING MODE C (506) | RATING OUTPUT-SUPPLY POWER (507) | THRESHOLD VALUE (508) |
|---|---|---|---|---|---|---|---|
| A0001 | SERVER BLADE | - | 300W | 270W | 240W | - | - |
| A0002 | SERVER BLADE | - | 250W | 220W | 210W | - | - |
| A0003 | SERVER BLADE | - | 200W | 170W | 160W | - | - |
| B0001 | POWER SUPPLY MODULE | - | - | - | - | 1200W | 100A |
| B0002 | POWER SUPPLY MODULE | - | - | - | - | 1080W | 90A |
| C0001 | OTHER MODULES | 30W | - | - | - | - | - |
| C0002 | OTHER MODULES | 40W | - | - | - | - | - |
| C0003 | OTHER MODULES | 35W | - | - | - | - | - |

DATA PROCESSING SYSTEM HAVING POWER CAPPING FUNCTION IN RESPONSE TO OUTPUT STATE OF POWER SUPPLY MODULE

CROSS-REFERENCE TO RELATED PATENT APPLICATIONS

Japan Priority Application 2010-136740, filed Jun. 16, 2010 including the specification, drawings, claims and abstract, is incorporated herein by reference in its entirety. This application is a Continuation of U.S. application Ser. No. 13/072,283, filed Mar. 25, 2011, incorporated herein by reference in its entirety.

BACKGROUND OF THE INVENTION

The present invention relates to a data processing system for monitoring an output state of power supply modules to implement a power capping for a data processing device in response to the output state.

A blade server is provided with a plurality of server blades and a mid-plane, inside a single chassis, for electrically connecting with a plurality of power supply modules, a plurality of I/O modules, a plurality of fan modules and a plurality of management modules. The plurality of power supply modules receive a power from either one or more circuits of power equipment.

A power redundancy technique is proposed as a technique having been used in the data processing device such as the server blade etc. The power redundancy technique includes a redundancy for either an input power source (hereinafter, input power source redundancy) or a power supply module (hereinafter, power supply module redundancy).

The input power source or power supply module redundancy means a technique for the security of continuously operating the data processing device in a condition where the input power source or power supply module is redundant (hereinafter, on power-source redundancy) and is not redundant (hereinafter, on power-source non-redundancy).

The input power source redundancy is provided with m circuits (m≥2) of the input power source to secure the continuous operation of the data processing device by a supply power only of the power supply module, received from the input power source of the rest of (m−1) circuits, even though the supply from the input power source on one circuit is shutdown. The power supply module redundancy is provided with N units (N≥2) of power supply module to secure the continuous operation of the data processing device by a supply power only from normal (N−1) units of power supply modules, even though the supply from one power source is shutdown.

In the past, the power supply modules to be mounted on the chassis in the blade server have been used such that their rating output wattage is all equivalent. In consequence, in the case where the input power source has two circuits in the input power source redundancy and total four-power supply module configuration includes two power supply modules connected per one circuit for each of the input source, for example, the power consumption of the server blade is always capped as power equal to or less than the amount of two power supply modules on the power-source redundancy (when the two input power source circuits are normal) to be able to operate continuously the data processing device by the input power source of normally supplied one circuit and the two power supply modules receiving the normally supplied power even on the power source non-redundancy (on a power supply shutdown from one circuit of the input-power source).

However, in this system, a summation of the supply power from power supply modules connected with the input power source in one circuit requires a power equal to or greater than a power consumption of the server blades. For this reason, there is a problem that the cost of power supply module is increased.

As means to solve the above-mentioned problem, JP-A-2009-267880 has been known as a system of power-source redundancy configuration providing N sets of power source units (corresponding to the power supply module in the server blade), in which the maximum power consumption of data processing device is allowed to exceed the supply power from (N−1) sets of power source units in a condition where the power source unit is redundant normally (on power-source unit redundancy); a clock frequency of the data processing device is lowered in a condition where an abnormality occurs in the power source unit to turn the power source unit into a non-redundancy (on power-source unit non-redundancy) to make the power consumption of data processing device to (N−1)/N. By using this system, it is unnecessary to be newly provided with the power supply module of high cost and high output even against the increase of power consumption of the data processing device.

SUMMARY OF THE INVENTION

However, the JP-A-2009-267880 discloses that the power consumption is capped on the basis of the presence or absence of failure or interruption in the power supply module, but the power consumption is not capped on the basis the excess or deficiency of the supply power. For this reason, there arises a problem that the lowering of operating frequency (performance, in other words) in the blade server occurs due to the capping of power consumption, even in the case where the power feeding can be implemented by the normally operated power supply module alone.

The object of the invention is realized by the following configuration. A blade server is provided with a plurality of power supply modules and one or more server blades therein. The plurality of power supply modules receive power supplies of AC or DC from one or more circuits of power-source equipment (hereinafter, referred to as an input power source). The power supply modules respectively are provided with current monitor units for acquiring output current values of the power supply modules, a threshold value hold unit for setting and holding threshold data of the output current value, a comparing unit for comparing the acquired output current value with the threshold value of the output current value which was set in advance, and a signal notification unit for asserting an output current excess notification signal when the output current value exceeds the threshold value. The server blade is provided with a power-saving control unit for capping (power capping) the power consumption of the server blade by controlling the frequency, voltage, etc. of a processor and is connected electrically with the output current excess notification signal of the power supply module. The output current excess notification signal is asserted to lower the power consumption of the server blade by the power-saving control unit and cap the output current of the power supply module to an equal to or less than the threshold value which was set in advance.

According to the invention, it is possible to judge a necessity for implementing the power capping control on the basis of the data indicating the excess or deficiency of the supply power. In consequence, the power capping is not implemented when the normally operated power supply module and input power source can supply a power on either the failure of one or a plurality of power supply modules and either the input power source shutdown of one or plural input power sources. The power capping is implemented when the power feeding is short by only using the normally operated power supply module and the input power source.

The other objects, features and advantages of the invention will become apparent from the following description of the embodiments of the invention taken in conjunction with the accompanying drawings.

BRIEF DESCRIPTION OF THE DRAWINGS

FIG. 5 is a diagram representing an example of power table;

DETAILED DESCRIPTION OF THE EMBODIMENTS

Figure 1:
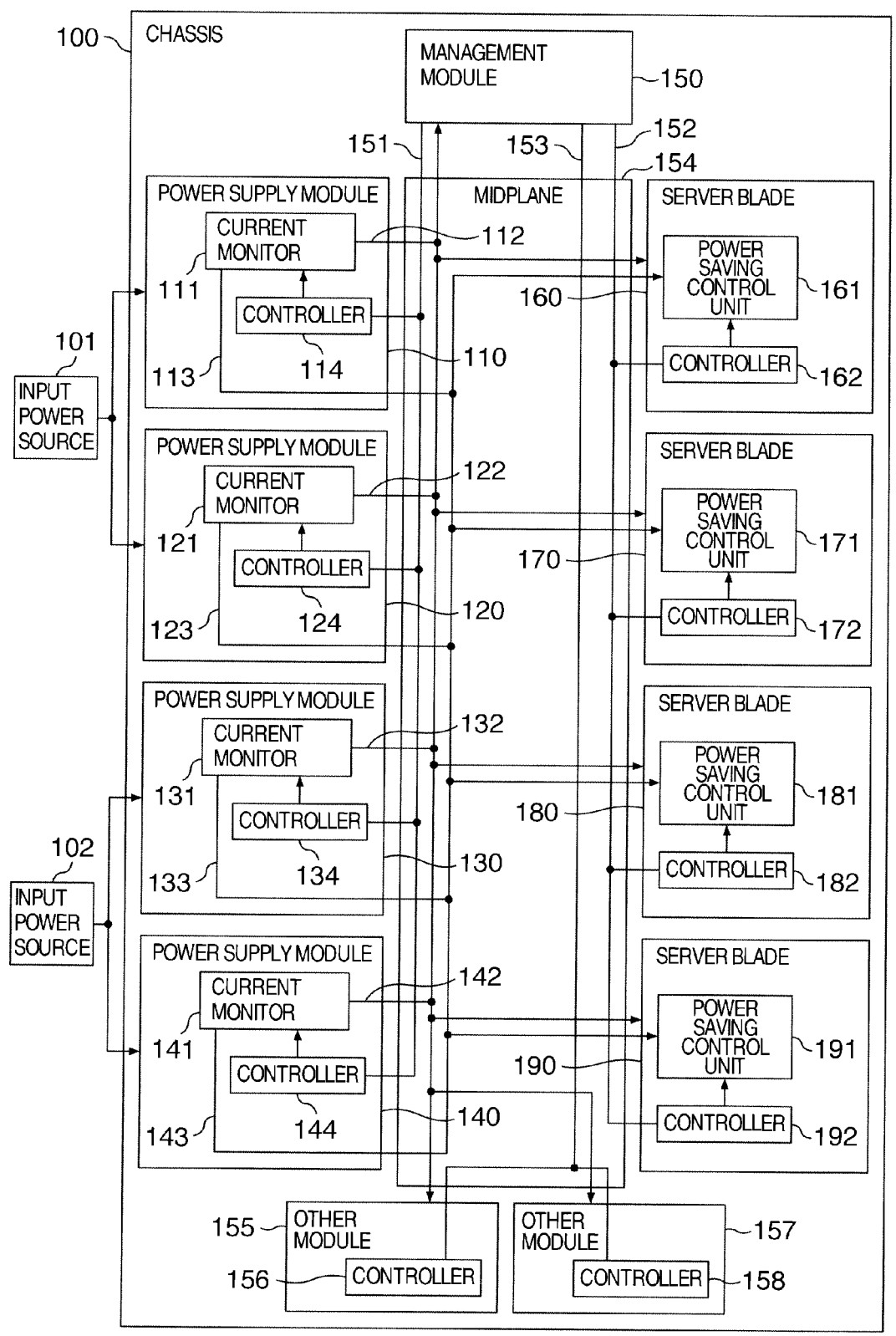
FIG. 1 is an overall configuration diagram representing a data processing system.

FIG. 1 is an overall configuration diagram of a data processing system applying the invention. A chassis 100 is provided with power supply modules 110, 120, 130, 140, a management module 150, a mid-plane 154, server blades 160, 170, 180, 190 and other modules 155, 157 therein (hereinafter, these are referred to as a module or modules). The chassis 100 also is provided with two-circuit input power sources 101, 102 outside thereof.

In addition, a power capping control system of the invention is applicable to the system configuration configured such that the power supply module is two units or more, the server blade is one unit or more, the management module is one unit or more (in this regard, it is required to control main management modules and standby management modules when there are plural management modules), the other module is more than zero unit, and the input-power source is one circuit or more.

The power supply modules 110, 120, 130, 140 are provided with current monitors 111, 121, 131, 141, controllers 114, 124, 134, 144, power-source supply lines 112, 122, 132, 142 and output-current excess notification signals 113, 123, 133, 143, respectively. The power supply module receives powers from two input power sources 101, 102 outside the chassis 100 to convert to utilizable voltages to the respective modules inside the chassis 100 and output a current. In addition, a maximum current value is defined as a rating output which can be supplied stably without having a smoking, ignition, failure and output voltage drop etc.

The controllers 114, 124, 134, 144 hold identification data of the respective power supply modules 110, 120, 130, 140, respectively. Here, the identification data of power supply modules is used for identifying a difference of specifications such as the type of power supply modules, the rating output and the type (for example, difference of voltage and AC or DC etc.) of utilizable input power source etc.

The power supply modules 110, 120 receive the power supplied from the input power source 101. The power supply modules 130, 140 receive the power supplied from the input power source 102. The input power source includes AC or DC, for example, AC 200 volts.

The power-source supply lines 112, 122, 132, 142 supply output currents from the power supply modules 110, 120, 130, 140 to the modules inside the chassis 100, respectively. The voltage of the power source supply lines 112, 122, 132, 142 is utilizable to the respective modules, for example, DC 12 volts.

The server blades 160, 170, 180, 190 are a module for implementing a calculation process and are provided with power-saving control units 161, 171, 181, 191 and controllers 162, 172, 182, 192, respectively.

The power-saving control units 161, 171, 181, 191 are provided with power saving functions for controlling the power-consumption upper-limit values of the server blades 160, 170, 180, 190, respectively.

The controllers 162, 172, 182, 192 hold operating-mode setting data on a power-source redundancy and power-source non-redundancy and the identification data of the server blades 160, 170, 180, 190, respectively.

Here, the operating mode means that the maximum-power consumption for the respective server blades 160, 170, 180, 190 is defined. The power-saving control units 161, 171, 181, 191 control the power consumptions of the server blades 160, 170, 180, 190, respectively, in such a way that the power becomes equal to or less than the maximum-power consumption in the operating mode on the power-source redundancy in a de-asserted condition of the output-current excess notification signal. The power-saving control units 161, 171, 181, 191 control the power consumptions of the server blades 160, 170, 180, 190, respectively, in such a way that the power becomes equal to or less than the maximum-power consumption in the operating mode on the power-source non-redundancy in the de-asserted condition of the output-current excess notification signal.

A specific example for the power saving function includes a method of controlling the power consumption of the server blades 160, 170, 180, 190 by controlling an operating frequency of a CPU or DIMM. In this embodiment, three types of the operating modes are defined, that is, the operating mode is set to A, B and C in descending order of the maximum-power consumption (for example, the maximum-power consumption=300 W on the operating mode A, the maximum-power consumption=270 W on the operating mode B and the maximum-power consumption=240 W on the operating mode C). The maximum-power consumption on the operating mode A is set to the maximum-power consumption of the server blade at a time when the power-saving control is not implemented by the power-saving control unit (for example, the maximum-power consumption=300 W when the power-saving control is not implemented).

In this embodiment, the operating mode for reducing the maximum-power consumption of the server blades 160, 170, 180, 190 by the power-saving control units 161, 171, 181, 191 is set to two types, the operating mode B and operating mode C. The type in this embodiment is not limited, but the operating mode for reducing the power-consumption may be one or two types even more than that. In this embodiment, the maximum-power consumption in the operating mode on the power-source redundancy is set to be greater than that in the operating mode on the power source non-redundancy (for example, the maximum-power consumption=300 W in the operating mode A as an operating mode on the power-source redundancy, and the maximum-power consumption=240 W in the operating mode C as an operating mode on the power source non-redundancy).

The identification data of server blade identifies a difference of the configuration inside the server blade, such as the number of CPU and DIMM mounted on the server blade.

The other modules 155, 157 do not have the power-saving control mechanism, such as power-saving control units 161, 171, 181, 191, for example. Specifically, the other modules include an I/O module such as a LAN switch, fiber channel switch, etc. and a fan module for cooling the respective modules inside the chassis 100. The other modules 155, 157 also are provided with controllers 156, 158 therein, respectively.

The controllers 156, 158 hold the identification data of the other modules 155, 157, respectively. The identification data of the other modules 155, 157 identify a difference of the LAN switch, fiber channel switch, etc., and the difference of detailed specifications (for example, the LAN switch has differences in the utilizable number of LAN ports, link rate, etc).

The management module 150 is connected with the controllers 114, 124, 134, 144 arranged inside the power supply modules 110, 120, 130, 140, respectively, via a management bus 151. The management module 150 is also connected with the controllers 156, 158 arranged inside the other modules 155, 157, respectively, via a management bus 153. The management module 150 is further connected with the controllers 162, 172, 182, 192 arranged inside the server blades 160, 170, 180, 190, respectively, via a management bus 152.

The mid-plane 154 is a multilayer board for electrically and mutually connecting with the power supply modules 110, 120, 130, 140, server blades 160, 170, 180, 190, the other modules 155, 157 and the management module 150. The mid-plane 154 is provided with electrical wirings for coupling the output-current excess notification signals 113, 123, 133, 143, the power source supply lines 112, 122, 132, 142 and the management buses 151, 152, 153.

In this embodiment, the output-current excess notification signals 113, 123, 133, 143 are coupled electrically with each other by wiring on the board of the mid-plane 154 and coupled to the respective power-saving control units 161, 171, 181, 191. However, the mid-plane 154 may have an electrically coupled structure such that one or more signals among the output-current excess notification signals 113, 123, 133, 143 are asserted to assert the power-saving control units 161, 171, 181, 191.

For example, an IC etc. operable of logical OR may be mounted on the mid-plane 154 to implement the logical OR of the output-current excess notification signals 113, 123, 133, 143. Alternatively, an implementation method may also be employed such that the output-current excess notification signal 113 is coupled electrically to the server blades 160, 170, 180, 190, the output-current excess notification signal 123 to the server blades 160, 170, 180 and 190, the output-current excess notification signal 133 to the server blades 160, 170, 180 and 190, and the output-current excess notification signal 143 to the server blades 160, 170, 180 and 190.

The power-saving control units 161, 171, 181, 191 operate the server blades 160, 170, 180, 190, respectively, in the operating mode on the power-source redundancy, when all of the output-current excess notification signals 113, 123, 133, 143 are set in the de-asserted condition. The power-saving control units 161, 171, 181, 191 operate the server blades 160, 170, 180, 190, respectively, in the operating mode on the power source non-redundancy, when one or more output-current excess notification signals 113, 123, 133, 143 are asserted.

In addition, regarding the electrical connection between the modules, one multilayer board as the mid-plane 154 is used in this embodiment, which is not limited to the embodiment. A plurality of multilayer boards, cables, etc. may also be used to connect with the modules.

Figure 2:
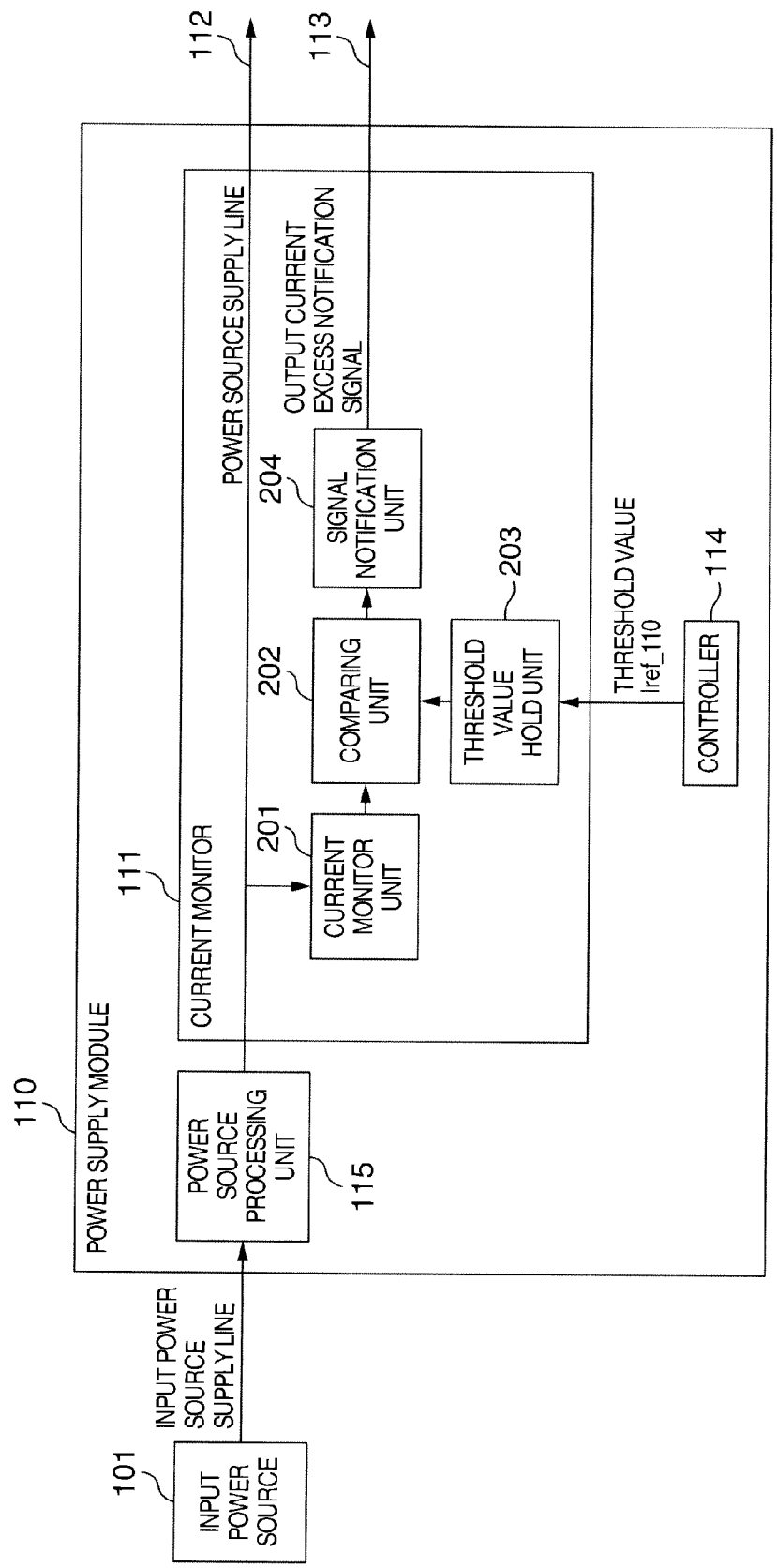
FIG. 2 is a configuration diagram representing an inside of a current monitor.

FIG. 2 is a configuration diagram representing an inside of the current monitor 111. The current monitors 121, 131, 141, other than the current monitor 111, also take the same configuration as represented in FIG. 2.

A power source processing unit 115 receives the power supplied from the input power source 101. The power source processing unit 115 converts the supplied AC into DC to then adjust the DC voltage to a voltage utilizable to the respective modules inside the chassis 100 and outputted to the power source supply line 112, when the input-power source 101 is the AC power source. The power source processing unit 115 adjusts the supplied DC voltage of the DC power supply source to a utilizable voltage to the respective modules inside the chassis 100 to then outputted to the power source supply line 112, when the input power source 101 is the DC power source.

A current monitor unit 201 measures an output current value flowing into the power source supply line 112.

A threshold-value hold unit 203 receives and holds a threshold value Iref_110 for comparing with the output current value measured by the current monitor unit 201, from the controller 114 outside the current monitor 111 (subsequently, the threshold values to be used in the power supply modules 110, 120, 130, 140 are set to Iref_110, Iref_120, Iref_130 and Iref_140, respectively). Normally, the threshold values Iref_110, Iref_120, Iref_130 and Iref_140 are set so as to be 0<threshold value≤rating output<maximum output current value of power supply module. Here, the maximum output current value of the power supply module is a maximum current value which can be outputted from the power supply module without dropping the output voltage while with a possibility that smoking, heating up, ignition and failure occur.

A comparing unit 202 compares the measured output current value with the threshold value Iref_110.

A signal notification unit 204 asserts the output-current excess notification signal 113 when output current value>Iref_110 is satisfied.

Figure 3:
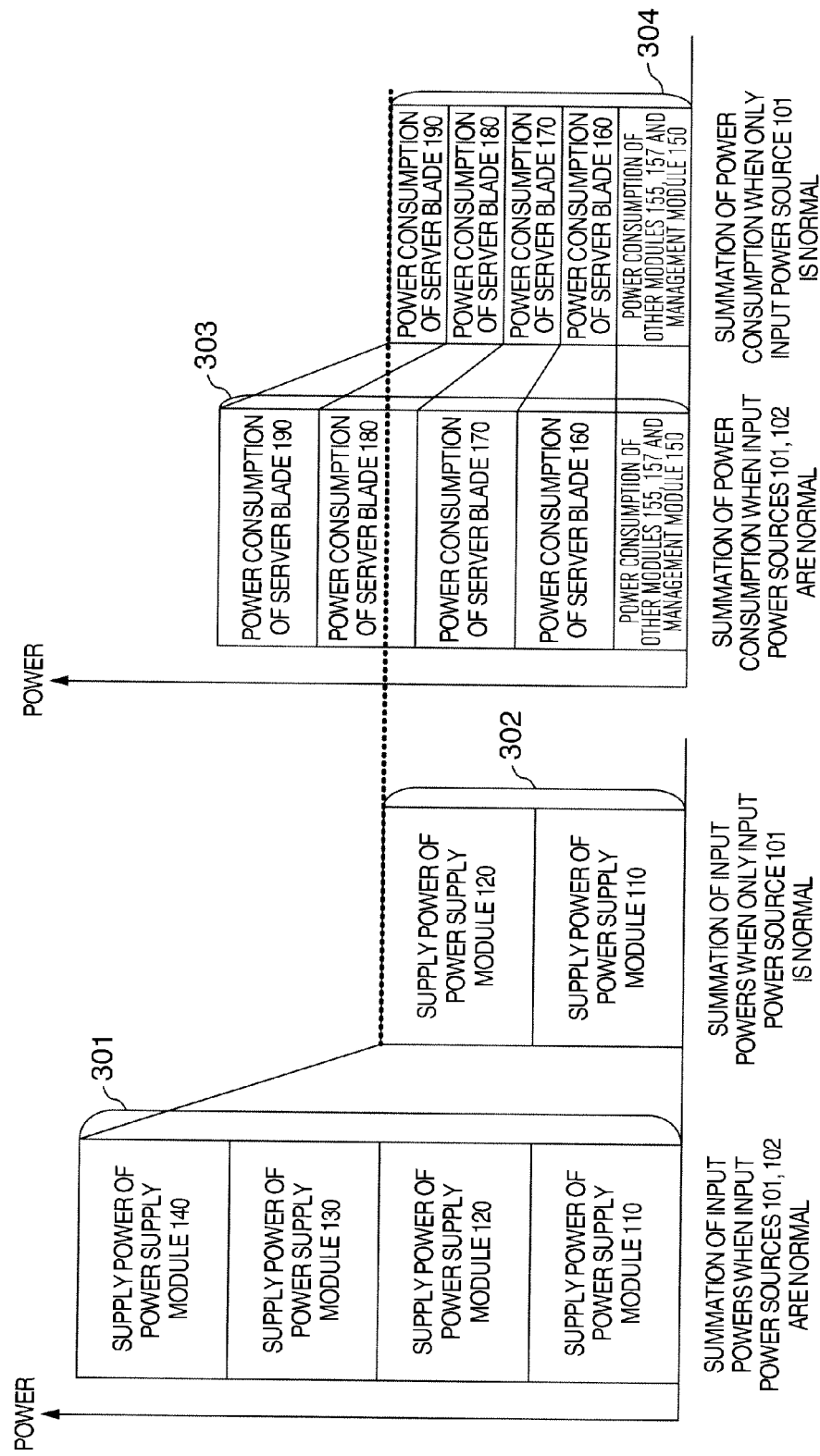
FIG. 3 is a diagram representing a variation of supply power and power consumption.

FIG. 3 represents a variation of the supply power and power consumption, in which a vertical axis indicates the supply power or power consumption.

A supply power 301 is a summation Ws of the supply power when the input power sources 101 and 102 are normal (on power-source redundancy). The supply power 301 is also a summation of the supply power to the power supply modules 110, 120, 130, 140 on the rating output.

A supply power 302 is a summation Ws_ac of the supply power when only the input-power source 101 is normal (on power source non-redundancy).

In this embodiment, the rating outputs of the power supply modules 110, 120, 130, 140 are set to all equivalent. Therefore, the supply power (Ws_ac) 302 becomes the half of the supply power (Ws) 301. The above-mentioned description is not limited to the embodiment, the power capping control is applicable to the embodiment even when the rating outputs of the power supply modules 110, 120, 130, 140 are not equivalent. For example, we consider a case in which the summation of supply power of power supply modules 110, 120, 130, 140 received from the input power source 101 on the rating output is smaller than that of the supply power of power supply modules 130, 140 received from the input power source 102 on the rating output. In this case, the summation of the supply power of power supply modules 110, 120 received from the input power source 101 on the rating output is compared with that of the supply power of power supply modules 130, 140 received from the input power source 102 on the rating output, and a smaller summation should be set to that of the supply power on the rating output.

A power consumption 303 is Wn_160+Wn_170+Wn_180+Wn_190+Wa when the power consumption of the server blades 160, 170, 180, 190 in the operating mode on the power-source redundancy is set to Wn_160, Wn_170, Wn_180, Wn_190 and the summation of power consumption of the other modules 155, 157 and the management module is set to Wa, in the case where the input power sources 101, 102 are normal (on power-source redundancy). In addition, it is required that the operating mode of the server blades 160, 170, 180, 190 on the power-source redundancy is set such that a relation, power consumption 303≤supply power 301, is satisfied, in this embodiment.

A power consumption 304 is Wp_160+Wp_170+Wp_180+Wp_190+Wa when the power consumption of the server blades 160, 170, 180, 190 in the operating mode on the power source non-redundancy is set to Wp_160+Wp_170+Wp_180+Wp_190, respectively, in the case where the supply of the input power source 102 is shutdown and only the input-power source 101 is normal (on power source non-redundancy). It is required that the power capping of the server blades 160, 170, 180, 190 is implemented such that a relation, power consumption 304≤supply power 302, is satisfied, in this embodiment.

Figure 4:
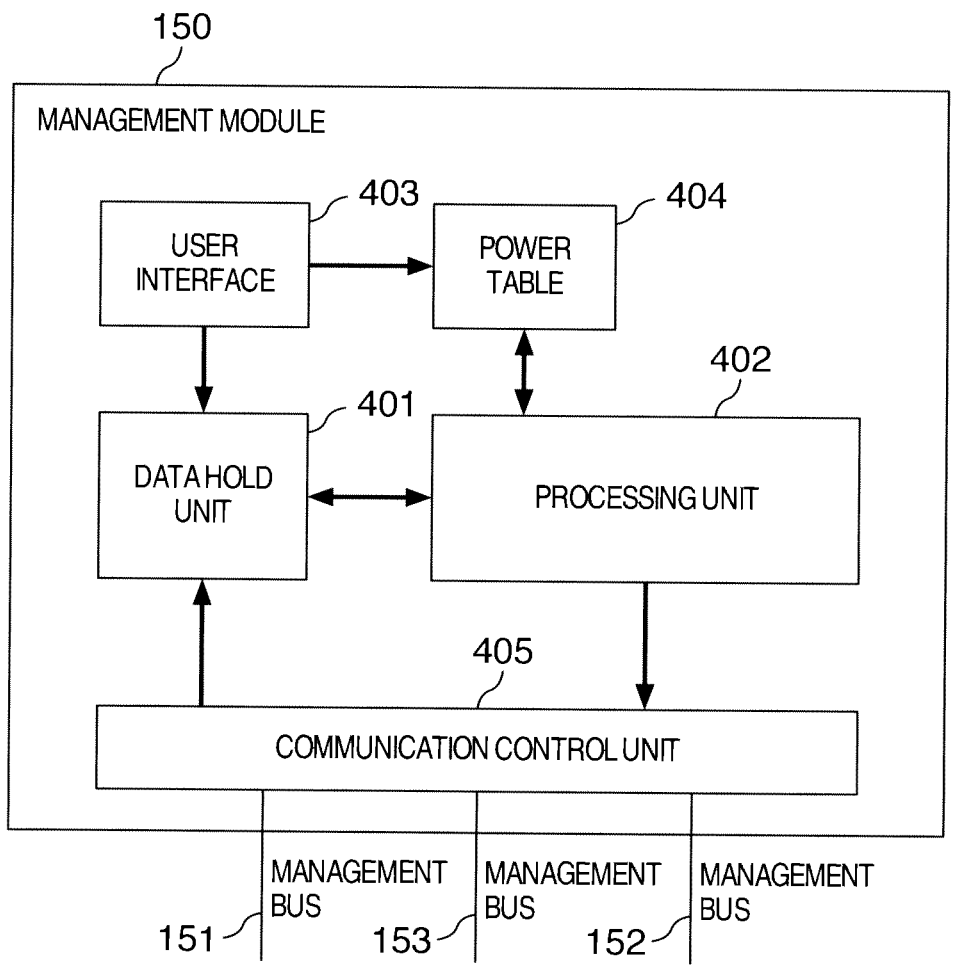
FIG. 4 is a configuration diagram representing an inside of a management module.

FIG. 4 represents a configuration diagram of the management module 150.

A communication control unit 405 acquires the identification data of the power supply modules 110, 120, 130, 140 from the controllers 114, 124, 134, 144 arranged respectively therein through the management bus 151.

The communication control unit 405 also acquires the identification data of the server blades 160, 170, 180, 190 from the controllers 162, 172, 182, 192 arranged respectively therein through the management bus 152.

The communication control unit 405 further acquires the identification data of the other modules 155, 157 from the controllers 156, 158 arranged respectively therein through the management bus 153.

The management module is one unit in this embodiment, however, it may be configured that a plurality of management modules are mounted inside the chassis 100, or one or more are mounted outside thereof.

In the plurality of management modules, they are divided into the active one and standby one. The active management module implements the above-mentioned operation. The standby management module implements the continuous operation in place of the active management module when it cannot continue the operation due to abnormality, failure occurrence, maintenance, etc.

Management buses 151, 152, 153 are provided all for the number of management modules when the management module is a plurality of units. A management bus is also added to between the active management modules and standby management modules. In consequence of adding the bus, the communication control unit inside one management module can acquire the identification data from the communication control unit of the other management modules.

The management buses 151, 152, 153 are independent with each other in this embodiment. However, the embodiment is not limited to the above-mentioned buses. The management buses 151, 152, 153 may be made into a single common bus. It may also be configured that the management buses 151, 152, 153 are divided into further plurality of numbers.

A user interface 403 outputs various data received as inputs to a data hold unit 401. Here, the various data received as inputs include data of the target sever blades to power (server blades 160, 170, 180, 190 in this embodiment), data of the power-source redundancy configuration indicating whether the input power source redundancy or power supply module redundancy is used (input power source redundancy is used, in this embodiment), and data of the target server blades to power in the operating mode on the power-source redundancy and of the power source non-redundancy. The user interface 403 receives the identification data of the server blades, the power supply modules, the other modules, and table data of the specification for the pieces of identification data inputted by a user to then output to a power table 404. An example of the user interface 403 includes a KVM (Keyboard/Video/Mouse), a connection of console, etc.

The data hold unit 401 holds the identification data of the server blades 160, 170, 180, 190 of the power supply modules 110, 120, 130, 140 and of the other modules 155, 157. The data hold unit 401 also holds the data of target server blades to power of the power-source redundancy configuration and of the target server blades to power in the operating mode on the power-source redundancy and the power source non-redundancy. The data hold unit 401 further holds a calculated result in a processing unit 402. The data hold unit 401 further holds own identification data of the management module 150. Here, the identification data of the management module 150 identify differences in the specification and the inner configuration of the management module. In addition, the management module is one unit in this embodiment, however, the data hold unit 401 may also hold the identification data of the other management modules when the management module is a plurality of units.

The power table 404 holds, as a table, the identification data of the server blades, the identification data of the power supply modules, the identification data of the other modules and the specification for the pieces of identification data.

FIG. 5 represents a specific example of the power table 404. The power table 404 holds corresponding data in the identification data 501 to the module classification 502.

The module classification 502 includes a classification of "server blade", "power supply module" and "other modules", in which each of the classified identification data is set to a data unit of one item (one line). In this embodiment, the classification called "server blade" is divided into three items, "A0001", "A0002" and "A0003".

In this embodiment, the controllers 162, 172, 182, 192 arranged respectively inside the server blades 160, 170, 180, 190 hold the identification data of either "A0001", "A0002" or "A0003" of the "server blade" in the module classification 502. The controllers 114, 124, 134, 144 arranged respectively inside the power supply modules 110, 120, 130, 140 hold the identification data of either "B0001" or "B0002" of the "power supply module" in the module classification 502. The controllers 156, 158 arranged respectively inside the other modules 155, 157 hold the identification data of either "C0001", "C0002" or "C0003" of the "other modules" in the module classification 502.

The power table 404 holds a maximum power consumption 504 on the operating mode A, a maximum power consumption 505 on the operating mode B and a maximum power consumption 506 on the operating mode C, corresponding to the respective data in the identification data 501, when the module classification 502 is the server blade.

The power table 404 also holds a rating output-supply power 507 as the supply power on the rating output for every type of the power supply modules corresponding to the respective data in the identification data 501 and a threshold value 508, when the module classification 502 is the power supply module.

The power table 404 further holds a maximum power consumption 503 corresponding to the respective data in the identification data 501, when the module classification 502 is the other modules.

Instead that the user interface 403 output to the power table 404 the respective data including the identification data 501, the module classification 502, the maximum power consumption 503, the maximum power consumption 504 on the operating mode A, the maximum power consumption 505 on the operating mode B, the maximum power consumption 506 on the operating mode C, the rating output-supply power 507 and the threshold value 508, the power table 404 may hold the respective data in advance.

The processing unit 402 acquires, from the data hold unit 401, the identification data of the server blades 160, 170, 180, 190, setting data in the operating mode on the power-source redundancy and setting data in the operating mode on the power source non-redundancy. The processing unit 402 also acquires, from the power table 404, the maximum power consumption in the operating mode on the power-source redundancy, on the basis of the identification data and the setting data in the operating mode on the power-source redundancy. In this embodiment, the power consumption is selected from either the maximum power consumption 504 on the operating mode A, the maximum power consumption 505 on the operating mode B or the maximum power consumption 506 on the operating mode C on the basis of the setting data in the operating mode on the power-source redundancy. For example, when the acquired identification data of the server blade 160 from the data hold unit 401 by the processing unit 402 is "A0001" and the setting data, in the operating mode on the power-source redundancy, acquired from the data hold unit 401 by the processing unit 402 is "operating mode C", the processing unit 402 acquires, from the power table 404, data so called "240 W" as a power consumption in the maximum power consumption 506 on the operating mode C corresponding to the identification data "A0001".

The maximum power consumptions acquired here in the setting data of the server blades 160, 170, 180, 190 in the operating mode on the power-source redundancy are Wn_160, Wn_170, Wn_180 and Wn_190, respectively.

The processing unit 402 acquires, from the power table 404, the maximum power consumption corresponding to the setting data in the operating mode on the power source non-redundancy, corresponding to the identification data.

The maximum power consumptions acquired here of the server blades 160, 170, 180, 190 corresponding to the setting data in the operating mode on the power source non-redundancy are determined to be Wp_160, Wp_170, Wp_180 and Wp_190, respectively.

The processing unit 402 acquires the identification data of the other modules 155, 157 and of the management module 150 from the data hold unit 401. The processing unit 402 also acquires the maximum power consumption 503 corresponding to the identification data of the other modules 155, 157 and corresponding to the identification data of the management module 150 from the power table 404.

The processing unit 402 calculates a summation of the maximum power consumption of the other modules 155, 157 and of the management module 150 to acquire a summation Wa of the power consumption.

The processing unit 402 acquires the identification data of the power supply modules 110, 120, 130, 140 from the data hold unit 401. The processing unit 402 also acquires the rating output-supply power 507 corresponding to the identification data of the power supply modules 110, 120, 130, 140 from the power table 404. The processing unit 402 then calculates the summation of the rating output-supply power 507 of the power supply modules 110, 120, 130, 14 to acquire a summation Ws of the supply power to the power supply modules on the power-source redundancy.

The processing unit 402 calculates a summation of the rating output-supply power of the power supply modules 110, 120 connected with the input power source 101 and a summation of the rating output-supply power of the power supply modules 130, 140 receiving a power from the input power source 102. The processing unit 402 then compares the summation of the rating output-power supply of the power supply modules 110, 120 with that of the rating output-power supply of the power supply modules 130, 140. From the compared result of the summations, a smaller summation is set to Ws_ac, and either one of the summations is set to Ws_ac when the both summations are equivalent. In this embodiment, the processing unit 402 sets the summation of the rating output-power supply of the power supply modules 110, 120 connected with the input power source 101 to Ws_ac.

The processing unit 402 compares the rating output-supply power of the power supply modules 110, 120, 130, 140 to then set the summation of the rating output-supply power of the power supply modules to Ws_dc, except for the power supply module having greatest rating output-supply power. When the rating output-supply powers of the power supply modules 110, 120, 130, 140 are all equivalent, the processing unit 402 calculates as Ws_dc the summation of the rating output-supply power of arbitrary three power supply modules among four. For example, in this embodiment, the processing unit 402 calculates as Ws_dc the summation of the rating output-supply power of the power supply modules 110, 120, 130.

The processing unit 402 also acquires the threshold value 508 corresponding to the identification data of the power supply modules 110, 120, 130, 140 from the power table 404. The processing unit 402 then sets the threshold value 508 of the power supply modules 110, 120, 130, 140 acquired from the power table 404 to the threshold values Iref_110, Ire_120, Iref_130, Iref_140, respectively.

The communication control unit 405 notifies Iref_110 to the controller 114, Iref_120 to the controller 124, Iref_130 to the controller 134, and Iref_140 to the controller 144 via the management bus 151.

The processing unit 402 judges the following three conditions, that is, judges whether a condition 1 or a condition 2 is satisfied and the condition 1 or a condition 3 is also satisfied.

$$(Wn\_160 + Wn\_170 + Wn\_180 + Wn\_190 + Wa) < Ws \quad \text{Condition 1:}$$

$$(Wp\_160 + Wp\_170 + Wp\_180 + Wp\_190 + Wa) < Ws\_ac \quad \text{Condition 2:}$$

$$(Wp\_160 + Wp\_170 + Wp\_180 + Wp\_190 + Wa) < Ws\_dc \quad \text{Condition 3:}$$

When the condition 1 is satisfied, it is shown that a relation, power consumption<supply power, is satisfied in the input power source redundancy and the power supply module redundancy configuration on the power-source redundancy.

When the condition 2 is satisfied, it is shown that a relation, power consumption<supply power, is satisfied in the input power source redundancy configuration on the power source non-redundancy.

When the condition 3 is satisfied, it is shown that a relation, power consumption<supply power, is satisfied in the power supply module redundancy configuration on the power source non-redundancy.

When either the condition 1 and the condition 2 are satisfied or the condition 1 and the condition 3 are satisfied, the communication control unit 405 implements a power-on instruction for the controllers 162, 172, 182, 192 arranged inside the server blades 160, 170, 180, 190, respectively, via the management bus 152.

In addition, the above-mentioned conditions 1 to 3 of judgment implemented by the processing unit 402 are used for the configuration of this embodiment, that is, two units of server blades, two input power sources, and four power supply modules.

When the server blade is configured by n units, there are two or more input power sources and there are two or more power supply modules, the conditions 1, 2 and 3 are described below.

In the condition 1, when the power consumptions of a first to n-th server blades in the operating mode on the power-source redundancy are set to Wn_1 to Wn_n, respectively, the following expression (1) is given.

$$Wa + \sum_{k=1}^{n} \{Wn\_k\} < Ws \quad \text{Expression (1)}$$

In the condition 2, the power consumptions of the first to n-th server blades in the operating mode on the power source non-redundancy are set to Wp_1 to Wp_n, respectively. Among the input power sources in the plurality of circuits, there is an input-power source whose summation of the rating output-supply power of the power supply modules receiving the power from the input power source becomes greatest. When the summation of the rating output-supply power of the power supply modules is set to Ws_m1, the following expression (2) is given.

$$Wa + \sum_{k=1}^{n} \{Wp\_k\} < Ws - Ws\_m1 \quad \text{Expression (2)}$$

In the condition 3, when the rating output-supply power of the power supply module having the greatest rating output among the plurality of power supply modules is set to Ws_max, the following expression (3) is given.

$$Wa + \sum_{k=1}^{n} \{Wp\_k\} < Ws - Ws\_max \quad \text{Expression (3)}$$

Figure 6:
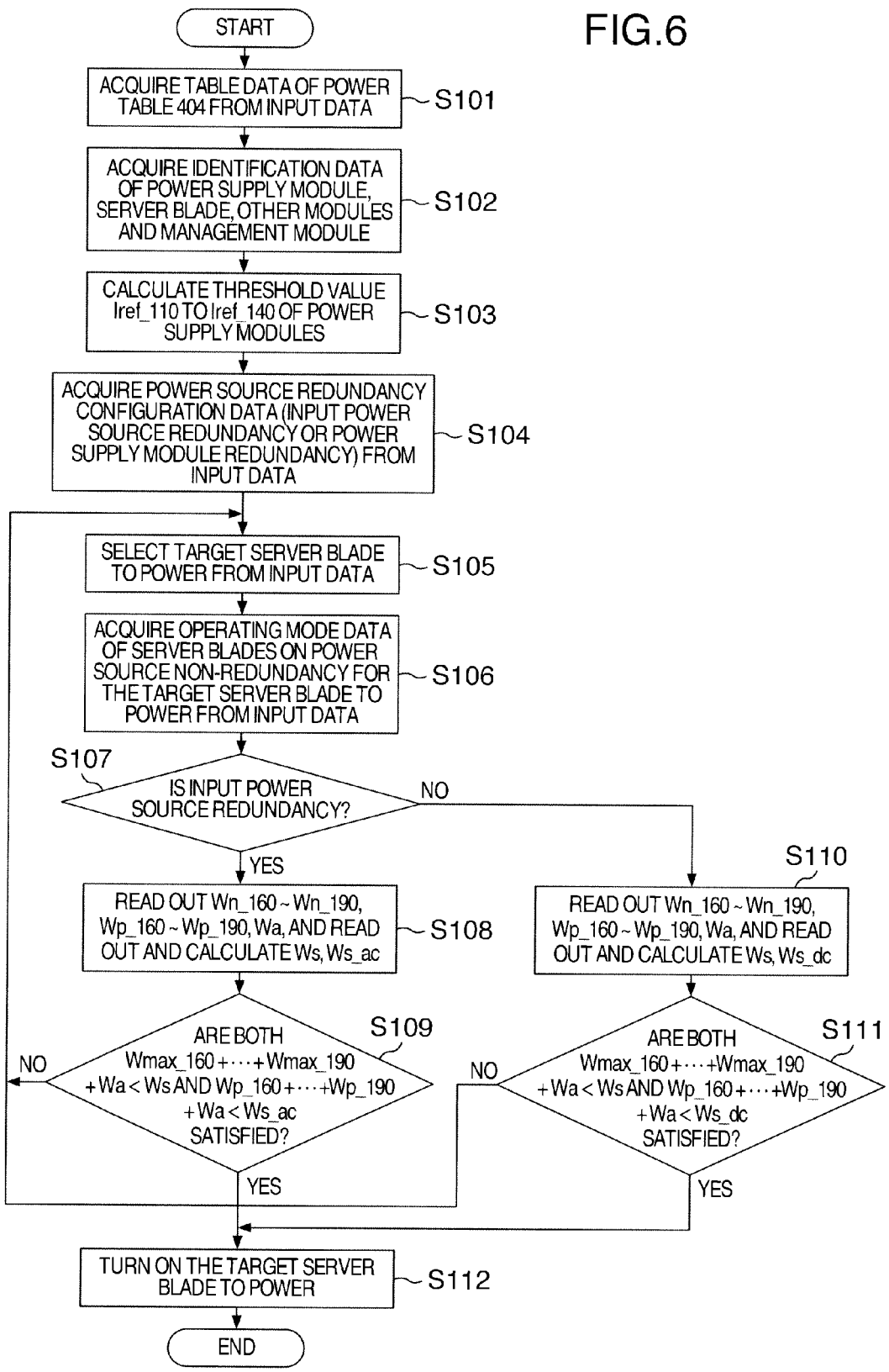
FIG. 6 is a control flowchart of the management module.

FIG. 6 represents a control flowchart of the management module 150 when the power source of the server blades 160, 170, 180, 190 are turned on.

At a step S101, the user interface 403 outputs power table data to the power table 404. The power table 404 then holds the power table data. In this embodiment, the user interface 403 outputs the power table data to the power table 404, however, the power table 404 may hold the power table data in advance.

At a step S102, the communication control unit 405 acquires the identification data of the power supply modules 110, 120, 130, 140, the identification data of the server blades 160, 170, 180, 190, the identification data of the other modules 155, 157 and the management module 150 through the management buses 151, 152, 153 and output to the data hold unit 401.

The data hold unit 401 holds the identification data supplied from the communication control unit 405.

At a step S103, the processing unit 402 acquires the identification data of the power supply modules 110, 120, 130, 140 from the data hold unit 401. The processing unit 402 then acquires data of the threshold values corresponding to the identification data of the power supply modules 110, 120, 130, 140 from the power table 404 and output to the communication control unit 405. The communication control unit 405 notifies the threshold value Iref_110 to the controller 114, Iref_120 to the controller 124, Iref_130 to the controller 134, and Iref_140 to the controller 144.

At a step S104, the user interface 403 outputs the power-source redundancy configuration data supplied from the user to the data hold unit 401. The data hold unit 401 holds the power-source redundancy configuration data supplied from the user interface 403.

At a step S105, the user interface 403 outputs data of the target server blades 160, 170, 180, 190 to power, supplied from the user, to the data hold unit 401. The data hold unit 401 holds the data of the target server blades 160, 170, 180, 190 to power.

At a step S106, the user interface 403 outputs the data of the target server blades 160, 170, 180, 190 to power, supplied from the user, in the operating mode on the power-source redundancy and non-redundancy, to the data hold unit 401. The data hold unit 401 then holds the data of the target server blades 160, 170, 180, 190 to power, supplied from the user interface 403, in the operating mode on the power-source redundancy and non-redundancy. The communication control unit 405 outputs the data in the operating mode on the power-source redundancy and non-redundancy to the controllers 162, 172, 182, 192 through the management bus 152. The controllers 162, 172, 182, 192 hold the data and output to the power-saving control units.

At a step S107, the processing unit 402 acquires the data of the power-source redundancy configuration from the data hold unit 401.

If the power-source redundancy configuration acquired by the processing unit 402 is the input power source redundancy at the step S107, the processing unit 402 acquires data from the power table 404 corresponding to the maximum power consumption Wn_160, Wn_170, Wn_180, Wn_190 corresponding to the operating mode on the power-source redundancy. The processing unit 402 acquires the data from the power table 404 corresponding to the maximum power consumption Wp_160, Wp_170, Wp_180, Wp_190 corresponding to the operating mode on the power source non-redundancy. The processing unit 402 then acquires the maximum power consumption of the management module 150 and the other modules 155, 157 from the power table 404 to calculate the summation Wa. The processing unit 402 also acquires the rating output-supply power of the power supply modules 110, 120, 130, 140 from the power table 404 to calculate the summation Ws. The processing unit 402 further calculates the summation Ws_ac on the basis of the rating output-supply power of the power supply modules 110, 120, 130, 140.

At a step S109, the processing unit 402 determines whether the condition 1, (Wn_160+Wn_170+Wn_180+Wn_190+Wa)<Ws, is satisfied, the condition 2, (Wp_160+Wp_170+Wp_180+Wp_190+Wa)<Ws_ac, is satisfied, and the condition 1 and the condition 2 are also satisfied.

If the condition 1 is satisfied at the step S109, the relation, (power consumption)<(supply power), is confirmed in the operating mode setting on the power-source redundancy, in the input power source redundancy configuration. If the condition 2 is satisfied, the relation, (power consumption)<(supply power), is confirmed in the operating mode setting on the power source non-redundancy, in the input power source redundancy configuration. If the condition 1 and the condition 2 are satisfied, the supply-power shortage is not present on the power-source redundancy and power-source non-redundancy, so that the operation can be implemented in the case where the data processing system is applied to the input power source redundancy configuration.

At a step S112, the communication control unit 405 outputs the instruction of the server blades 160, 170, 180, 190 to power to the controllers 162, 172, 182, 192, respectively, inside the target server blades 160, 170, 180, 190 to power through the management bus 152. The controllers 162, 172, 182, 192 turn on the power source of the sever blades 160, 170, 180, 190, respectively.

When either the condition 1 or the condition 2 is not satisfied at the step S109, the relation of either, (power consumption)<(supply power), in the operating mode setting on the power-source redundancy or that in the operating mode setting on the power-source non-redundancy is not satisfied in the input power source redundancy configuration. This means that the supply power becomes short on the power-source redundancy or power-source non-redundancy when using the data processing system. For this reason, the process returns to the operation at the step S105, and it is required to change the number of units of the target server blades 160, 170, 180, 190 to power and/or the data of target server blades 160, 170, 180, 190 to power in the operating mode on the power-source redundancy and power source non-redundancy at the step S106.

At the step S107, if the power-source redundancy configuration is determined as the power supply module redundancy in the processing unit 402, the processing unit 402 acquires the data corresponding to the maximum power consumption Wn_160, Wn_170, Wn_180, Wn_190 corresponding to the operating mode on the power-source redundancy from the power table 404, and also acquires the data corresponding to the maximum power consumption Wp_160, Wp_170, Wp_180, W0_190 corresponding to the operating mode on the power source non-redundancy from the power table 404, at a step S110. The processing unit 402 also acquires the maximum power consumption of the management module 150 and the other modules 155, 157 from the power table 404 to calculate the summation Wa, and further acquires the rating output-supply power of the power supply modules 110, 120, 130, 140 from the power table 404 to calculate the summation Ws. The processing unit 402 then calculates the summation Ws_dc on the basis of the rating output-supply power of the power supply modules 110, 120, 130, 140.

At a step S111, the processing unit 402 determines whether the condition 1, (Wn_160+Wn_170+Wn_180+Wn_190+Wa)<Ws, is satisfied, the condition 3, (Wp_160+Wp_170+Wp_180+Wp_190+Wa)<Ws_dc, is satisfied, and the condition 1 and the condition 3 are satisfied.

If the condition 1 and the condition 3 are satisfied at the step S111, the communication control unit 405 turns on the power source to the target server blades 160, 170, 180, 190 via the management bus 152 at the step S112.

If either the condition 1 or the condition 3 is not satisfied at the step S111, the process returns to the step S105, and it is required to change the number of units of the target server blades 160, 170, 180, 190 to power and/or the data of the target server blades 160, 170, 180, 190 to power in the operating mode on the power-source redundancy and power source non-redundancy at the step S106.

Figure 7:
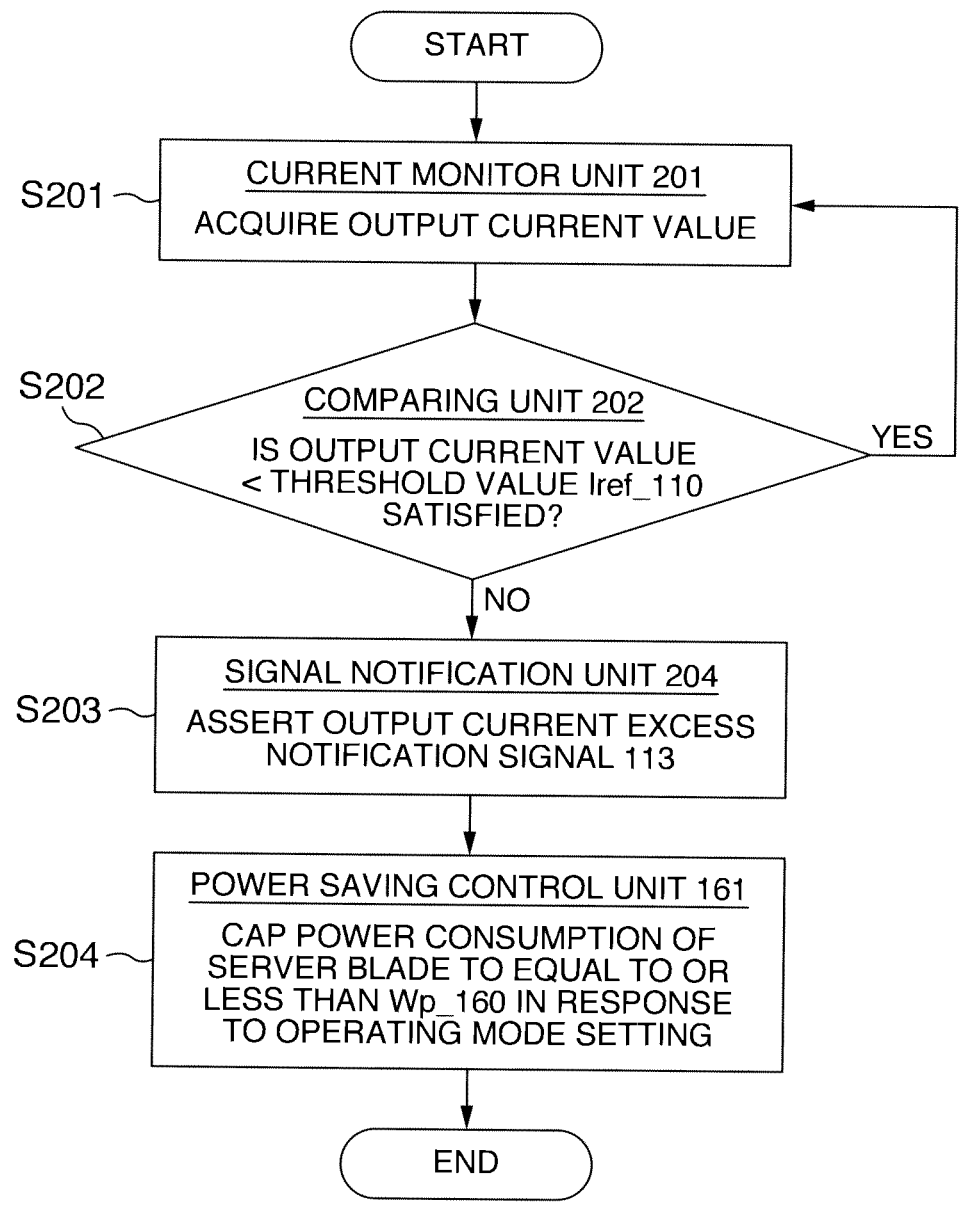
FIG. 7 is a control flowchart of the current monitor and a power-saving control unit.

FIG. 7 represents a control flowchart of the current monitor and the power-saving control unit when occurring a power supply shutdown of the input-power source 102, after the power source of the server blades 160, 170, 180, 190 is turned on by the management module 150. FIG. 7 represents an operating example for the power supply module 110 and the server blade 160, but the other power supply modules 120, 130, 140 and the server blades 170, 180, 190 also use this operating flowchart.

At a step S201, the current monitor 201 inside the power supply module 110 measures an output current value of the power supply line 112 and output to the comparing unit 202.

At a step S202, the comparing unit 201 compares the output current value on the power supply line 112 supplied from the current monitor unit 201 with the threshold value Iref_110 of the power supply module 110 supplied from the threshold hold unit 203.

If a relation, (output current value of power source supply line 112)≤Iref_110, is satisfied at the step S202, the comparing unit 202 notifies a compared result to a signal notification unit 204, and the process returns to the step S201.

If the relation, (output current value of power source supply line 112)>Iref_110, is satisfied at the step S202, the comparing unit 202 notifies the compared result to the signal notification unit 204.

At a step S203, when the signal notification unit 204 receives from the comparing unit 202 the compared result indicating that the condition is satisfied, that is, receives a notification indicating that the result is, (output current value of power source supply line 112)>Iref_110, the output current excess notification signal 113 is asserted.

At a step S204, the power-saving control unit 161 inside the server blade 160 receives the assertion of output current excess notification signal 113. The power-saving control unit 161 received the assertion of output current excess notification signal 113 implements a power-saving control for the power consumption of the server blade 160 in accordance with the operation mode setting. In consequence, the power consumption of the server blade 160 becomes equal to or less than the maximum power consumption Wp_160.

The operating flowchart represented in FIG. 7 is also applicable to the power supply modules 120, 130, 140 and the server blades 170, 180, 190. The operating outline of entire power capping in this embodiment will described below.

The power from the input power source 102 is shutdown, and the output of the power supply modules 130, 140 is also shutdown. Therefore, the relation, (output current value of power source supply line 112)>Iref_110, is given to the power supply module 110.

The relation, (output current value of power source supply line 122)>Iref_120 is also given to the power supply module 120.

The output current excess notification signal is asserted by the signal notification units arranged respectively inside the power supply modules 110, 120.

All of the power-saving control units 161, 171, 181, 191 receive the assertion of output current excessive notification signals (113, 123), respectively.

The power-saving control units 161, 171, 181, 191 cap the power consumptions of server blades 160, 170, 180, 190 to an equal to or less than the maximum power consumption Wp_160, Wp_170, Wp_180, Wp_190, respectively. The relation, (output current value of power source supply line)≤ (current threshold value), is satisfied in the power supply modules 110, 120, so that the power supply can be continued normally. In consequence, the server blade can operate continuously.

Assumingly, when the process at the steps S109, S111 is absent in this embodiment, it is not secured that the summation (Wp_160+Wp_170+Wp_180+Wp_190+Wa) of the power consumption of the server blades 160, 170, 180, 190, the other modules 155, 157 and the management module 150 becomes smaller than the summation Ws_ac and Ws_dc of the supply power on the power source non-redundancy, after capping the power at the step S204.

In fact, it is secured that the power consumption of the server blades 160, 170, 180, 190 on the implementation of the power capping at the step S204 becomes certainly smaller than the summation Ws_ac and Ws_dc, in response to the confirmation of various conditions at the steps S109, S111 in this embodiment.

In this embodiment, a trigger of implementing the power capping is that the output current of power supply modules 110, 120 exceeds the threshold value set in advance. The supply power at this time is the power immediately after changed from the supply power 301 to the supply power 302 in FIG. 3. The power consumption at this time lies in the power-source non-redundancy, but still lies in the power consumption 303, therefore the power capping is not implemented yet.

Figure 8:
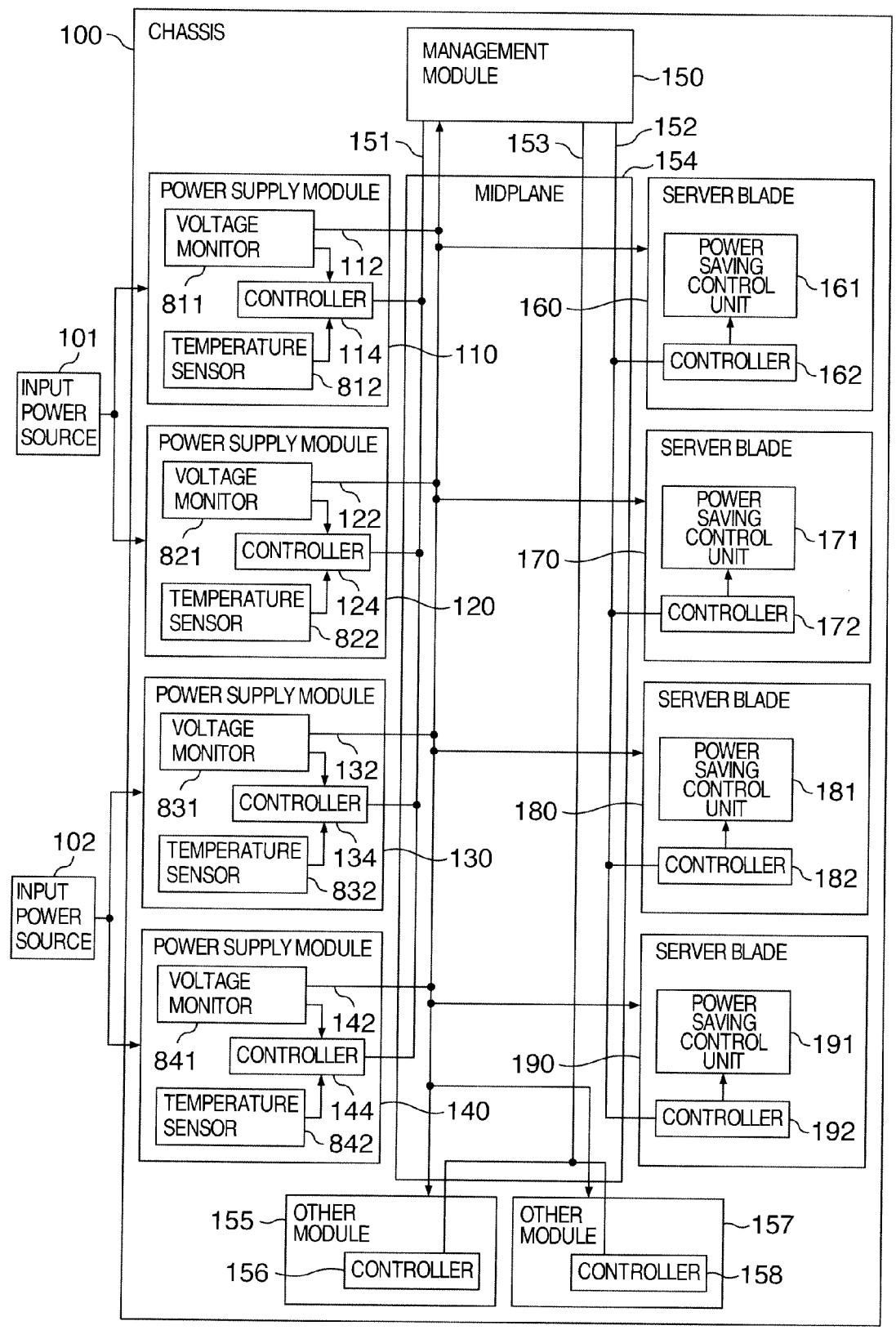
FIG. 8 is an overall configuration diagram representing the data processing system using a related art.

FIG. 8 represents a configuration diagram of the case where a conventionally known system is realized by this embodiment, in relation to the implementation of capping the power of the server blade in response to an interruption occurrence in the power supply module. The reference number of elements represented in FIG. 1 is appended to the same elements as that in FIG. 8. In addition, the configuration inside the management module 150 is the same as that in FIG. 2.

As represented in FIG. 8, voltage monitors 811, 821, 831, 841 are arranged inside the power supply modules 110, 120, 130, 140, respectively. The voltage monitors 811, 821, 831, 841 acquire and hold the output voltage data of power source supply lines 113, 123, 133, 143, respectively. Temperature sensors 812, 822, 832, 842 are arranged inside the power supply modules 110, 120, 130, 140, respectively. The temperature sensors 812, 822, 832, 842 acquire and hold temperature data inside the power supply modules 110, 120, 130, 140, respectively. The controllers 114, 124, 134, 144 receive the output voltage data from the voltage monitors 811, 821, 831, 841, respectively. The controllers 114, 124, 134, 144 also receive the temperature data from the temperature sensors 812, 822, 832, 842, respectively. The controllers 114, 124, 134, 144 further acquire and hold periodically the temperature data and the output voltage data of power supply modules 110, 120, 130, 140, respectively.

The communication control unit 405 inside the management module 150 receives the temperature data and the voltage data of power supply modules 110, 120, 130, 140 from the controllers 114, 124, 134, 144 through the management bus 151. The data hold unit 401 receives and holds the temperature data of power supply modules 110, 120, 130, 140 and the output voltage data of the power source supply lines 113, 123, 133, 143 from the communication control unit 405. The data hold unit 401 holds a temperature threshold value and voltage threshold data in advance so that the failure and abnormal condition are determined for 110, 120, 130, 140.

The processing unit 402 receives the temperature data, voltage data, temperature threshold value and the voltage threshold value data of power supply modules 110, 120, 130, 140 from the data hold unit 401. The processing unit 402 compares the temperature data with the voltage threshold value of the power supply modules 110, 120, 130, 140. If the respective temperature data of power supply modules 110, 120, 130 or 140 are greater than the threshold value, it is judged that a failure occurred for the corresponding power supply modules 110, 120, 130 or 140 the interruption. The processing unit 402 also compares the voltage data with the voltage threshold value data on the power source supply lines of power supply modules 110, 120, 130, 140. If the respective voltage data on the power source supply lines of power supply modules 110, 120, 130, 140 is smaller than the voltage threshold value, it is judged that a failure occurred for the corresponding power supply module 110, 120, 130 or 140.

From the above-mentioned determination of the voltage data and temperature data, the communication control unit 405 outputs an implementation instruction of power capping to the controllers 162, 172, 182, 192 arranged inside the server blades 160, 170, 180, 190, respectively, through the management bus 152 if it is determined that a failure occurred for either one of the power supply modules 110, 120, 130, 140. The controllers 162, 172, 182, 192 output the implementation instruction of power capping to the power-saving control units 161, 171, 181, 191, respectively. The power-saving control units 161, 171, 181, 191 cap the power consumption of the server blades 160, 170, 180, 190, respectively.

However, in the conventional system, the presence or absence of exceeding the threshold value is set to a criterion of the failure on the basis of the comparison of the temperature data of the power supply module and the voltage data on the power source supply line with the previously held temperature threshold value and voltage threshold value data. The presence and absence of the failure in the power supply modules 110, 120, 130, 140 are targeted to trigger the implementation of capping the power, therefore, that the actual relation between the supply power and the power consumption is not considered. In consequence, there is a problem that the power capping is implemented in accordance with a rule that exceeds the threshold value, even though the supply power is not actually short against the power consumption.

In response, the system using the invention is provided with the comparing unit 203 inside the power supply modules 110, 120, 130, 140 so that it is realized that the difference between the supply power and the power consumption is monitored as a function. The comparing unit 202 is disposed inside the each power supply module, therefore, it is possible to measure directly the supply power (output power) of the power supply module for the server blade. The power capping is implemented when the relation, (power consumption)> (supply power), is satisfied, but it is not implemented when the relation, (power consumption)≤(supply power), is satisfied in the power supply module, even though the voltage on the power source supply line becomes small. Therefore, the system using the invention solves the problem such that power capping is implemented to thereby reduce a capability even when the supply power is not short against the power consumption in the conventional system.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A data processing system comprising a plurality of server blades, a plurality of input power sources, a plurality of power supply modules configured to convert a power supplied from said plurality of input power sources into a voltage to output to said plurality of server blades, and a management module connected with said plurality of server blades and said plurality of power supply modules via buses,
   wherein each of said plurality of power supply modules includes a power-source supply line connected electrically with said plurality of server blades and one of said plurality of input power sources, a current measurement unit configured to measure an output-current value supplied to said plurality of server blades on said power source supply line, and a comparing unit configured to compare said measured output current value with a predetermined threshold value, and
   wherein when the comparing unit of one power supply module of said plurality of power supply modules determines said output current value of said one power supply module is greater than said predetermined threshold value,
      a signal notification unit of said one power supply module is configured to output an output-current excess signal to said plurality of server blades, and
      each of said plurality of server blades is programmed to control a power consumption of said each server blade to an equal to or smaller than a predetermined power consumption value in response to said output-current excess signal.

2. The system according to claim 1,
   wherein said plurality of input power sources include a first power source and a second power source, and
   wherein said plurality of power supply modules are configured as a first plurality of power supply modules corresponding to said first power source and a second plurality of power supply modules corresponding to said second power source.

3. The system according to claim 2,
   wherein when said first power source and said first plurality of power supply modules corresponding to said first power source are failed, said second plurality of power supply modules corresponding to said second power source inputs power to said plurality of server blades without said first power source and said first plurality of power supply modules.

4. The system according to claim 1, wherein said threshold value is set via said management module by user.

5. A data processing method for operating a system comprising a plurality of server blades, a plurality of input power sources, a plurality of power supply modules configured to convert a power supplied from said plurality of input power sources into a voltage to output to said plurality of server blades, and a management module connected with said plurality of server blades and said power supply modules via buses, wherein each of said plurality power supply modules includes a power-source supply line connected electrically with said plurality of server blades and one of said plurality of input power sources, the method comprising:
   measuring an output-current value supplied to said plurality of server blades on said power source supply line;
   comparing said measured output current value with a predetermined threshold value;
   outputting an output-current excess signal to said plurality of server blades when one power supply module of said plurality power supply modules determines that said output-current value of said one power supply module is greater than said predetermined threshold value; and
   controlling, by each of said plurality of server blades in response to said output-current excess signal, a power consumption of said each server blade to be equal to or smaller than a predetermined power consumption value.

6. The method according to claim 5,
   wherein said plurality of input power sources include a first power source and a second power source,
   wherein said plurality of power supply modules are configured as a first plurality of power supply modules corresponding to said first power source and a second plurality of power supply modules corresponding to said second power source.

7. The method according to claim 6,
   wherein when said first power source and said first plurality of power supply modules corresponding to said first power source are failed, said second plurality of power supply modules corresponding to said second power source inputs power to said plurality of server blades without said first power source and said first plurality of power supply modules.

8. The method according to claim 5,
   wherein said threshold value is set via said management module by user.

* * * * *